United States Patent
Romeo et al.

(10) Patent No.: US 7,211,462 B2
(45) Date of Patent: May 1, 2007

(54) PROCESS FOR LARGE-SCALE PRODUCTION OF CDTE/CDS THIN FILM SOLAR CELLS

(75) Inventors: Nicola Romeo, Parma (IT); Alessio Bosio, Parma (IT); Alessandro Romeo, Parma (IT)

(73) Assignee: Solar Systems & Equipments S.r.l., Lucca (IT)

( * ) Notice: Subject to any disclaimer, the term of this patent is extended or adjusted under 35 U.S.C. 154(b) by 26 days.

(21) Appl. No.: 10/491,938

(22) PCT Filed: Oct. 4, 2002

(86) PCT No.: PCT/IT02/00634

§ 371 (c)(1),
(2), (4) Date: Apr. 5, 2004

(87) PCT Pub. No.: WO03/032406

PCT Pub. Date: Apr. 17, 2003

(65) Prior Publication Data

US 2004/0248340 A1    Dec. 9, 2004

(30) Foreign Application Priority Data

Oct. 5, 2001 (IT) ................................. LU2001A0008
Oct. 17, 2001 (IT) ................................. LU2001A0012
Oct. 17, 2001 (IT) ................................. LU2001A0011

(51) Int. Cl.
*H01L 21/00* (2006.01)

(52) U.S. Cl. .......................... 438/95; 438/93; 438/102; 438/57; 257/184

(58) Field of Classification Search ................ 438/57, 438/93, 94, 95, 98, 102; 257/183, 184
See application file for complete search history.

(56) References Cited

U.S. PATENT DOCUMENTS

| 5,304,499 A | | 4/1994 | Bonnet et al. ............... 437/5 |
| 6,137,048 A | * | 10/2000 | Wu et al. .................. 136/260 |
| 6,251,701 B1 | * | 6/2001 | McCandless ................ 438/95 |
| 6,572,782 B2 | * | 6/2003 | Campo et al. .............. 216/75 |

FOREIGN PATENT DOCUMENTS

EP  1130880 A  12/2001

OTHER PUBLICATIONS

Romeo, N. et al., "A highly efficient and stable CdTe/CdS thin film solar cell", *Solar Energy Materials And Solar Cells*, Elsevier Science Publishers, Amsterdam, The Netherlands, vol. 58, No. 2, Jun. 1999, pp. 209–218, XP004177956, ISSN: 0927-0248.

* cited by examiner

Primary Examiner—Bradley K. Smith
(74) Attorney, Agent, or Firm—Pollack, P.C.

(57) ABSTRACT

A process for large-scale production of CdTe/CdS thin film solar cells, films of the cells being deposited, in sequence, on a transparent substrate, the sequence comprising the steps of: depositing a film of a transparent conductive oxide (TCO) on the substrate; depositing a film of CdS on the TCO film; depositing a film of CdTe on the CdS film; treating the CdTe film with $CdCl_2$; depositing a back-contact film on the treated CdTe film. Treatment of the CdTe film with $CdCl_2$ comprises the steps of: forming a layer of $CdCl_2$ on the CdTe film by evaporation, while maintaining the substrate at room temperature; annealing the $CdCl_2$ layer in a vacuum chamber at a temperature generally within a range of 380° C. and 420° C. and a pressure generally within a range of 300 mbar and 1000 mbar in an inert gas atmosphere; removing the inert gas from the chamber so as to produce a vacuum condition, while the substrate is kept at a temperature generally within a range of 350° C. and 420° C. whereby any residual $CdCl_2$ is evaporated from the CdTe film surface.

19 Claims, 2 Drawing Sheets

PROCESS FOR LARGE-SCALE PRODUCTION OF CDTE/CDS THIN FILM SOLAR CELLS

FIELD OF THE INVENTION

The present invention relates generally to alternative energy resources technology and, more particularly, to solar energy storage and the like.

BACKGROUND OF THE INVENTION

Conventional CdTe/CdS solar cells typically comprise a transparent glass substrate carrying a transparent conductive oxide (TCO) film, a CdS film serving as the n-conductor, a CdTe film serving as the p-conductor and a metallic back-contact. A solar cell of this general description is disclosed, for example, in U.S. Pat. No. 5,304,499, which issued on Apr. 19, 1994.

While this "float" glass concept may be adapted for commercial use as a transparent substrate, frequent diffusion of Na into the TCO film has often resulted. Consequently, despite its relatively low cost, special glasses are often preferred over such a "float" glass arrangement.

Perhaps the most common TCO material is $In_2O_3$ which contains about 10% Sn (ITO). This material is usually characterized by a very low resistivity on the order of $3\times10^{-4}$ $\Omega$cm and a relatively high transparency (>85%) in the visible spectrum. While useful this material is made by sputtering and, after several runs, the ITO target forms noodles which contain excess In. In addition, a discharge may occur between noodles during sputtering which can damage the film.

Another material that is commonly used for the transparent conductive oxide film is fluorine doped $SnO_2$. Although helpful, this material exhibits a higher resistivity close to about $10^{-3}$ $\Omega$cm. As a result, a 1 µm thick layer is necessary to keep the sheet resistance at about 10 $\Omega/_{square}$. Generally, a high TCO thickness decreases the transparency and, in turn, the photocurrent of the solar cell. In addition, a novel material, namely $Cd_2SnO_4$, developed by the NREL group (X. Wu et al., *Thin Solid Films*, 286 (1996) 274–276)) has been utilized. However, since the target is made up of a mixture of CdO and $SnO_2$, CdO being considered highly hygroscopic, the stability of the target has often been found unsatisfactory.

Generally speaking, the CdS film is deposited either by sputtering or Close-Spaced Sublimation (CSS) from a CdS granulate material. The latter technique allows thin films to be prepared at a substrate temperature considerably higher than that used in simple vacuum evaporation or sputtering. This is because the substrate and evaporation source are positioned very close to one another, i.e., at a distance of 2–6 mm, and deposition is performed in the presence of an inert gas such as Ar, He or $N_2$ at a pressure of about $10^{-1}$–100 mbar. A higher substrate temperature usually allows growth of a better quality crystalline material. A significant characteristic of close-spaced sublimation is a very high growth rate up to about 10 µm/min, which is suitable for large-scale production.

Next, a CdTe film is deposited on the CdS film through close-spaced sublimation at a substrate temperature of 480–520° C. CdTe granulate is generally used as a source of CdTe which is vaporized from an open crucible.

An important step in the preparation of high efficiency CdTe/CdS solar cells is the treatment of CdTe film with $CdCl_2$. Traditionally, most research groups would perform this step by depositing a layer of $CdCl_2$ on top of CdTe by simple evaporation or by dipping the CdTe in a methanol solution containing $CdCl_2$, and then annealing the material in air at about 400° C. for between about 15 and about 20 min. It is generally believed that $CdCl_2$ treatment improves the crystalline quality of CdTe by increasing the size of the small grains and removing defects in the material.

After $CdCl_2$ treatment, the CdTe is etched in a solution of Br-methanol or in a mixture of nitric and phosphoric acid. Etching is necessary as CdO or $CdTeO_3$ are generally formed on the CdTe surface. CdO and/or $CdTeO_3$ must be removed in order to provide for good back-contact onto the CdTe film. Also, it is believed that, since etching produces a Te-rich surface, formation of an ohmic contact when a metal is deposited on CdTe is facilitated.

The electric back-contact on the CdTe film is generally obtained by deposition of a film of a highly p-dopant metal for CdTe such as copper, e.g., in graphite contacts, which, upon annealing, can diffuse in the CdTe film. Use of a $Sb_2Te_3$ film as a back-contact in a CdTe/CdS solar cell is set forth by applicants in N. Romeo et al., *Solar Energy Materials & Solar Cells*, 58 (1999), 209–218).

Industrial interest in thin films solar cells has increased in recent years, especially in view of the relatively high conversion efficiency achieved. Recently, for instance, a record 16.5% conversion efficiency was reported (see X. Wu et al., *17th European Photovoltaic Solar Energy Conversion Conference*, Munich, Germany, 22–26 Oct. 2001, II, 995–1000). Accordingly, a number of attempts have been made to provide processes suitable for large-scale, in-line production of CdTe/CdS thin film solar cells. A state-of-the art report of these efforts may be found in D. Bonnet, *Thin Solid Films* 361–362 (2000), 547–552. While helpful, they include crucial steps that also affect either the stability and efficiency of CdTe/CdS thin film solar cells or their costs, thereby hindering achievement of a commercially viable process.

A significant problem of these processes is the etching step to which the CdTe surface must be submitted for removing CdO or $CdTeO_3$ oxides that form thereon. Although etching requires the steps of immersing substrates carrying the treated CdTe/CdS films into acid solutions, rinsing and drying, machinery suitable for such continuous operation does not currently exist. Another difficulty that can negatively affect the stability of TCO films, as well as the cost of the final product, are the aforementioned disadvantages encountered using known TCOs. Moreover, known TCOs typically require the use of special glasses, such as borosilicate glass, to avoid Na diffusion and associated damage to the film that often occurs when soda-lime glass is used.

A further drawback of conventional processes relates to the source from which the CdS film and the CdTe film are produced through close-spaced sublimation. When relatively small pieces of these materials which contain dust, are used as a sublimation source, because of a different thermal contact, some micro-particles can overheat and, together with the vapor, split onto the substrate. In an attempt to avoid this inconvenience, complicated metallic masks are often used which make continuous operation problematic.

OBJECTS AND SUMMARY OF THE INVENTION

Accordingly, it is an object of the present invention to provide a process suitable for large-scale production of stable and efficient CdTe/CdS thin film solar cells using a low cost substrate.

Another object of the present invention is to provide a process for large-scale production of stable and efficient CdTe/CdS thin film solar cells in which the CdTe film is treated with $CdCl_2$ so as to eliminate the need for an etching step for removal of oxides that may form on the CdTe film.

It is a further object of the present invention to provide a process for large-scale production of stable and efficient CdTe/CdS thin film solar cells in which deposition of the TCO film is conducted such that a film of very low resistivity can be deposited without formation of metal noodles on the target, thereby enabling a relatively inexpensive substrate to be used.

Still another object of the present invention is to provide a process for large-scale production of stable and efficient CdTe/CdS thin film solar cells which allows formation of CdS and CdTe films that are entirely free of dust.

It is yet another object of the present invention to provide a CdTe/CdS thin film solar cell that is stable, efficient and relatively low-cost.

According to one aspect of the present invention, treatment of CdTe film with $CdCl_2$ is accomplished by first forming a layer of $CdCl_2$ having a thickness between about 100 and about 200 nm on the CdTe film by evaporation, while keeping the substrate at room temperature; then annealing the $CdCl_2$ layer in a vacuum chamber at a temperature generally within a range of 380 and 420° C. and a pressure between about 300 and about 1000 mbar under an inert gas atmosphere; and, finally, removing the inert gas from the chamber so as to produce a vacuum condition, while the substrate is maintained at a temperature generally within a range of 350 and 420° C., whereby any residual $CdCl_2$ is evaporated from the CdTe film surface. As a result, etching treatment of the CdTe film is unnecessary and the process can be conducted continuously.

According to another aspect of the present invention, the TCO layer is formed by sputtering in an inert gas atmosphere containing approximately 1–3 vol. % hydrogen and a gaseous fluoroalkyle compound, in particular, $CHF_3$. In this manner, the TCO is doped with fluorine.

According to a further aspect of the present invention, as a source material for formation of the CdS and CdTe films by sputtering or close-spaced sublimation, a CdS or CdTe material, respectively, is used in the form of a relatively compact block.

Further features of the process according to the invention are set forth in the dependent claims.

In accordance with still another aspect of the present invention, a process is provided for large-scale production of CdTe/CdS thin film solar cells, films of the cells being deposited, in sequence, on a transparent substrate, the sequence comprising the steps of depositing a film of a transparent conductive oxide (TCO) on the substrate; depositing a film of CdS on the TCO film; depositing a film of CdTe on the CdS film; treating the CdTe film with $CdCl_2$; and depositing a back-contact film on the treated CdTe film. In treatment of the CdTe film with CdCl, initially a layer of $CdCl_2$ is formed on the CdTe film by evaporation, while maintaining the substrate at room temperature. Second, the $CdCl_2$ layer is annealed in a vacuum chamber at a temperature, generally within a range of 380° C. and 420° C. and a pressure generally within a range of 300 mbar and 1000 mbar in an inert gas atmosphere. Finally, the inert gas is removed from the chamber so as to produce a vacuum condition, while the substrate is kept at a temperature generally within a range of 350° C. and 420° C., whereby any residual $CdCl_2$ is evaporated from the CdTe film surface.

According to yet another aspect of the present invention, a process is provided for large-scale production of CdTe/CdS thin film solar cells, films of the cells being deposited, in sequence, on a transparent substrate, the sequence comprising the steps of (i) depositing a film of a transparent conductive oxide (TCO) on the substrate; (ii) depositing a film of CdS on the TCO film; (iii) depositing a film of CdTe on the CdS film; (iv) treating the CdTe film with $CDCl_2$; and (v) depositing a back-contact film on the treated CdTe film, wherein the transparent conductive oxide is $In_2O_3$ doped with fluorine.

In accordance with still a further aspect of the present invention, a process for large-scale production of CdTe/CdS thin film solar cells is provided. Films of the cells are deposited, in sequence, on a transparent substrate, the sequence comprising the steps of: depositing a film of a transparent conductive oxide (TCO) on the substrate; depositing a film of CdS on the TCO film; depositing a film of CdTe on the CdS film; treating the CdTe film with $CdCl_2$; and depositing a back-contact film on the treated CdTe film, wherein as a source material for the formation of the CdS and the CdTe films by close-spaced sublimation, a CdS or CdTe material, respectively, generally in the form of a compact block is used.

Yet a further aspect of the present invention is directed to a CdTe/CdS thin film solar cell comprising a transparent substrate on which a layer of a transparent conductive oxide (TCO) is deposited. A CdS layer is deposited on the TCO layer, a CdTe layer is deposited on the CdS layer and a back-contact layer on the CdTe layer, wherein the transparent conductive oxide is $In_2O_3$ doped with fluorine and the back-contact layer is formed by a layer of $Sb_2Te_3$ or $As_2Te_3$ covered by a layer of Mo.

BRIEF DESCRIPTION OF THE DRAWINGS

These and other objects and advantages of the process for large-scale production of CdTe/CdS thin film solar cells, according to the present invention, will become apparent from the following description of specific, illustrative embodiments thereof made with reference to the following drawings, in which.

The same numerals are used throughout the drawing figures to designate similar elements. Still other objects and advantages of the present invention will become apparent from the following description of the preferred embodiments.

DETAILED DESCRIPTION OF THE PREFERRED EMBODIMENTS

Figure 1:
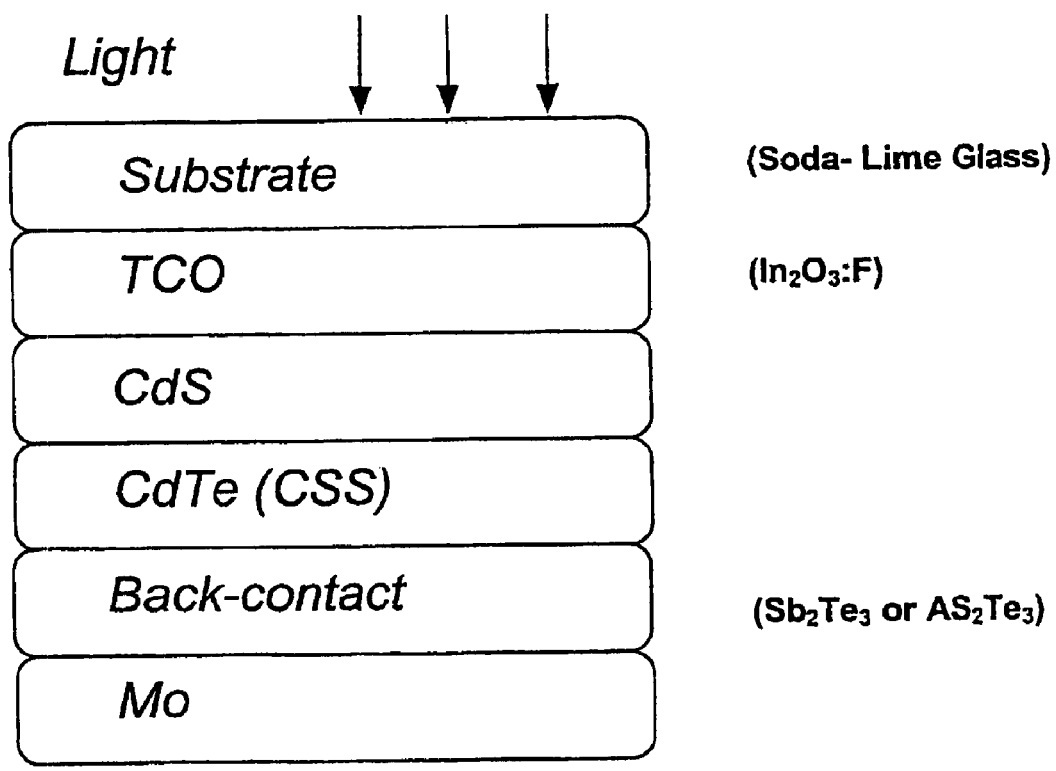
FIG. 1 is a schematic diagram showing a film deposition sequence for producing CdTe/CdS thin film solar cells, according to one aspect of the present invention.
Figure 2:
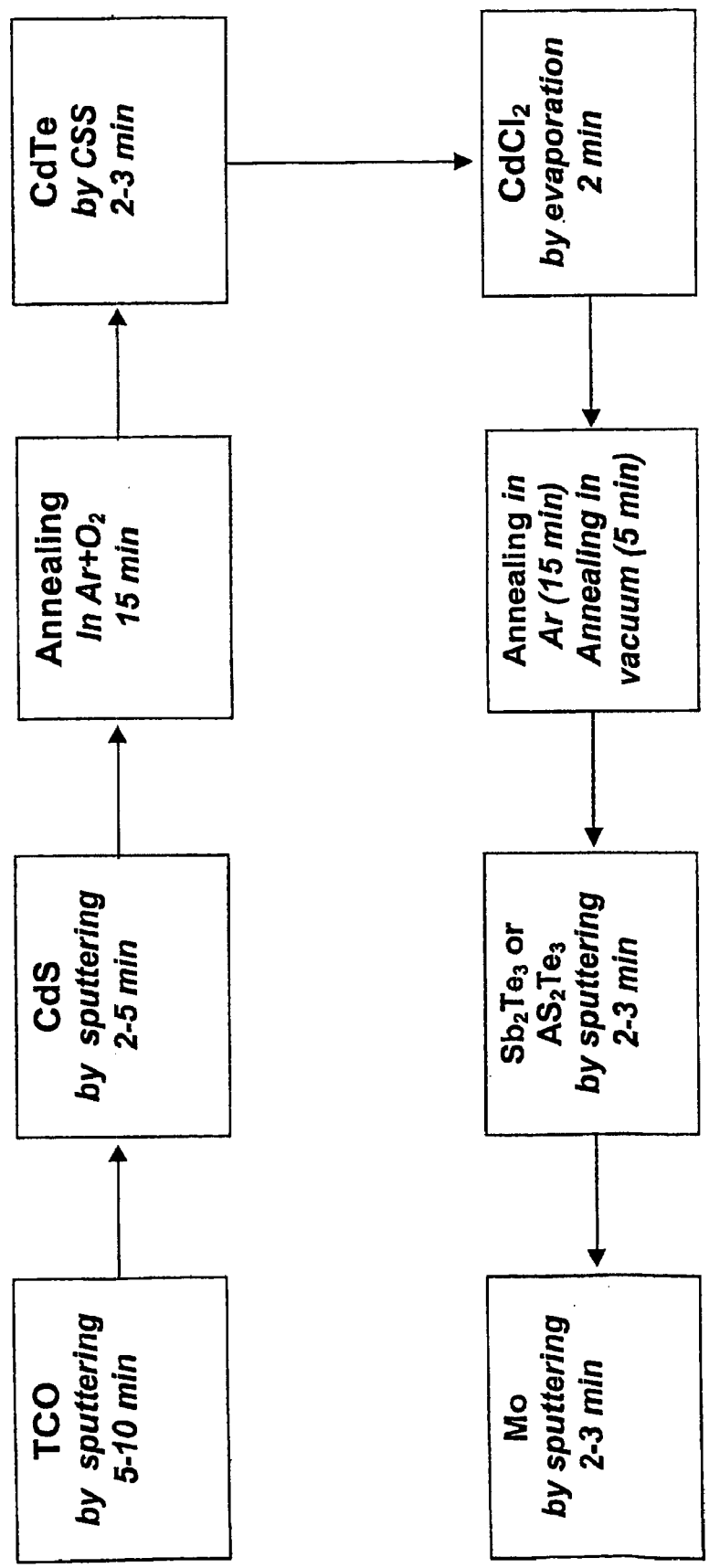
FIG. 2 is a flow diagram showing a process for producing CdTe/CdS thin film solar cells, according to another aspect of the present invention.

Referring now to the drawings and, more particularly, to FIGS. 1–2, there is shown generally a specific, illustrative process for producing CdTe/CdS solar cells, according to the present invention. Such solar cells comprise five layers deposited in a selected sequence on a transparent base layer or substrate, the layers consisting of about a 300 nm to about a 500 nm thick layer of a transparent conducting oxide (TCO), about an 80 nm to about a 200 nm thick layer of CdS deposited on the TCO layer, about a 4 μm to about a 12 μm thick layer of CdTe on the CdS layer and a back contact layer formed of at least about a 100 nm thick layer of $Sb_2Te_3$ and 100 nm thick layer of Mo. In particular, the transparent base substrate preferably comprises soda-lime glass and the transparent conducting oxide is desirably fluorine-doped ($In_2O_3$.F).

TCO layer consists of $In_2O_3$, which is doped with fluorine during growth. The $In_2O_3$ target, unlike ITO, does not form any noodles. A very low resistivity is obtained by introducing a relatively small amount of fluorine to the sputtering chamber in the form of a gaseous fluoroalkyle compound such as $CHF_3$ and a small amount of $H_2$ in the form of a mixture with an inert gas such as a $Ar+H_2$ mixture, in which $H_2$ is around 20% in respect to Ar. A typical example is a generally 500 nm thick film of $In_2O_3$ deposited with a deposition rate generally higher than about 10 Å/sec at a substrate temperature of approximately 500° C., with an Ar flow-rate of about 200 sccm, a $CHF_3$ flow-rate of roughly 5 sccm and an $Ar+H_2$ flow-rate of around 20 sccm. Accordingly, the reactive sputtering gas comprises Ar in the amount of about 2.5 vol. % of $CHF_3$ and about 1.8 vol. % of $H_2$. This film exhibits a sheet resistance of approximately 5 $\Omega/_{square}$, a resistivity of $2.5 \times 10^{-4}$ $\Omega$cm and a transparency higher than about 85% in the wavelength generally within a range of 400 and 800 nm. Another characteristic of this film is its high degree of stability as well as its ability to prevent Na diffusion from the soda-lime glass. This has been demonstrated by making CdTe/CdS solar cells on top of this type of TCO which have shown to be very stable, even if heated to about 180° C. when illuminated by "ten suns" for several hours.

After deposition of the CdS and CdTe films in the known way of sputtering or close-spaced sublimation, the CdTe film surface is treated with $CdCl_2$ as follows.

First, 200 nm of $CdCl_2$ are deposited by evaporation on top of CdTe film with the substrate kept at room temperature. Annealing is then performed for about 15–20 min at approximately 400° C. in a vacuum chamber in which roughly 500 mbar of Ar is introduced. After annealing, the chamber evacuated while keeping the substrate at a temperature of about 400° C. for 5 min. Since $CdCl_2$ has a relatively high vapor pressure at about 400° C., any residual $CdCl_2$ re-evaporates from the CdTe surface. It is noted that CdO or CdTeO, are not formed since annealing is conducted in an inert atmosphere, which does not generally contain $O_2$.

According to various aspects of the present invention, a Te-rich surface is not needed to obtain a non-rectifying contact if the contact is made by depositing a thin layer of a relatively highly conducting p-type semiconductor, such as $Sb_2Te_3$ or $As_2Te_3$, on top of the CdTe film. Generally speaking, a good, non-rectifying contact is achieved on a clean CdTe surface if a layer of $Sb_2Te_3$ or $As_2Te_3$ at least about 100 mm thick is deposited by sputtering at a substrate temperature of between about 250 and about 300° C. and between about 200 and about 250° C., respectively. $Sb_2Te_3$ grows naturally as p-type with a resistivity of around $10^{-4}$ $\Omega$cm, whereas $As_2Te_3$ also grows as p-type but with a resistivity of roughly $10^{-3}$ $\Omega$cm. The contact procedure is then completed by covering the low resistivity p-type semiconductor with at least about 100 nm of $Mo_2$ as is considered common practice in the art. A relatively thin layer of Mo is necessary in order to have a relatively low sheet-resistance on the back-contact.

As a source of CdS and CdTe materials used to form the respective layers by sputtering or CSS, a granulate material can be used, as is common practice in the art. However, in view of the disadvantages indicated above, when operating in this way, according to a preferred embodiment of the present invention, a new sublimation source can be used which consists of a relatively compact block obtained by melting and solidifying the material in an oven capable of sustaining a temperature generally higher than the melting temperature of the material.

A procedure for preparing the CdS compact block is as follows: pieces of CdS are put in a graphite container of the desired volume together with boron oxide ($B_2O_3$), which is a low melting point material (450° C.) and exhibits a very low vapor pressure when melted. Since boron oxide has a density lower than that of CdS in the molten state, it floats over the CdS and covers the CdS completely upon cooling. In this way, CdS covered with $B_2O_3$, if it is placed in an oven containing an inert gas at a pressure higher than approximately 50 atm. does not evaporate even at a temperature higher than its melting point. Since CdS melts at a temperature of about 1750° C., the oven is heated up to a temperature of about 1800° C. or more, and then cooled down to room temperature. In this manner, a unique compact block of CdS is obtained that is particularly suitable for use as a sublimation source in a close-spaced sublimation system. CdS films prepared using this type of source resulted in a very smooth film that is completely free of dust. The CdS films used to prepare the CdTe/CdS solar cells are typically approximately 100 nm thick. The substrate temperature is preferably kept between about 200 and 300° C. when CdS is prepared by sputtering and generally within a range of 480 and 520° C. when it is prepared by close-spaced-sublimation. The sputtered CdS layer generally requires annealing at about 500° C. in an atmosphere containing $O_2$ in order for the CdS/CdTe solar cell to exhibit a relatively high efficiency. In the case where CdS is prepared by close-spaced sublimation, $O_2$ is introduced to the sublimation chamber during deposition. While the role of $O_2$ is not known, it is presumed to passivate the CdS grain boundaries.

In accordance with another embodiment of the present invention, the CdTe source too is a generally compact block obtained through melting and solidifying pieces of CdTe in an oven under high pressure, as described previously. Since CdTe melts at around 1120° C., the oven must be heated to about 1200° C. in order to have complete melting of the CdTe pieces. CdTe films are deposited on the CdS by close-spaced sublimation at a substrate temperature generally within a range of 480 and 520° C. Deposition rates during CdTe growth are typically about 4 μm/min. In this manner, about 8 μm of CdTe are deposited in approximately 2 minutes.

By following the procedure described above, several solar cells have been prepared using as a substrate a 1 inch square low-cost soda-lime glass. A typical area of these cells is 1 $cm^2$. The finished cells are generally put under 10–20 suns for several hours at a temperature of around 180° C. in the open-circuit-voltage ($V_{oc}$) conditions. Advantageously, an increase in efficiency of about 20% or more is, thereby, achieved and without any material degradation.

The efficiency of these cells is generally within a range of 12% and 14% with open-circuit-voltages ($V_{oc}$) larger than approximately 800 mV, short-circuit-currents ($J_{ac}$) of between about 22 and about 25 $MA/cm^2$ and fill-factors (ff) ranging from about 0.6 to about 0.66.

EXAMPLE

A cell exhibiting an efficiency of around 14% has been prepared in the following way: soda-lime glass is covered with 500 nm of In$_2$O$_3$.F (fluorine-doped) deposited at a substrate temperature of about 500° C. as described above. 100 nm of CdS are then deposited thereon by sputtering at approximately 300° C. substrate temperature and annealed for about 15 min. at approximately 500° C. in 500 mbar of Ar containing about 20% O$_2$. 8 µm of CdTe are deposited on top of the CdS by CSS at a substrate temperature of approximately 500° C. Both the CdS and CdTe films are produced from a relatively compact block source as described above. A treatment with 150 nm of CdCl$_2$ is then performed in an Ar atmosphere, as described above. Finally, a back-contact is created, without any etching, by depositing, in sequence, through sputtering about 150 nm of Sb$_2$Te$_3$ and 150 nm of Mo.

After one hour under 10 suns at a temperature of about 180° C. in open-circuit conditions, the solar cell prepared in this way exhibited the following characteristics:

| | |
|---|---|
| V$_{OC}$ | 852 mv |
| J$_{SC}$ | 25 mA/cm$^2$ |
| ff | 0.66 |
| efficiency | 14% |

The techniques used in this process, such as sputtering and close-spaced sublimation, are fast, reproducible and easily scalable.

In general, sputtering systems capable of covering an area of around 1×0.5 m$^2$ of glass are already commercially available, while close-spaced sublimation, which at a laboratory scale can readily cover 20×20 cm$^2$ area glass, does not yield any problems in being scaled up to about 1.5×0.5 m$^2$. An in-line process can work well if a large area glass is moved slowly over the different sources, namely, TCO, CdS, CdTe, Sb$_2$Te$_3$ or As$_2$Te$_3$, and Mo. In order to connect the single cells in series, the in-line system desirably also includes three laser scribing processes, the first one after the TCO deposition, the second one before the back-contact deposition, and the third at the end of the process. An relatively important part of the process, according to the present invention, is that no acids or liquids are used and, as a consequence, the process can be conducted on a continuous basis without interruption as is often needed to for etching in acid or in a Br-methanol solution.

Various modifications and alterations to the invention may be appreciated based on a review of this disclosure. These changes and additions are intended to be within the scope and spirit of the invention as defined by the following claim.

What is claimed is:

1. A process for large-scale production of CdTe/CdS thin film solar cells, films of the cells being deposited, in sequence, on a transparent substrate, the sequence comprising the steps of:
   depositing a film of a transparent conductive oxide (TCO) on the substrate;
   depositing a film of CdS on the TCO film;
   depositing a film of CdTe on the CdS film;
   treating the CdTe film with CdCl$_2$; and
   depositing a back-contact film on the treated CdTe film;
   wherein the treatment of the CdTe film with CdCl$_2$ comprises the steps of:
   forming a layer of CdCl$_2$ on the CdTe film by evaporation, while maintaining the substrate at room temperature;
   annealing the CdCl$_2$ layer in a vacuum chamber at a temperature generally within a range of 380° C. and 420° C. and a pressure generally within a range of 300 mbar and 1000 mbar in an inert gas atmosphere; and
   removing the inert gas from the chamber so as to produce a vacuum condition, while the substrate is kept at a temperature generally within a range of 350° C. and 420° C. whereby any residual CdCl$_2$ is evaporated from the CdTe film surface.

2. The process set forth in claim 1, wherein the CdCl$_2$ layer is between about 100 nm and about 200 nm thick.

3. The process set forth in claim 1, wherein annealing of the CdCl$_2$ layer is carried out for about 15–20 minutes.

4. The process set forth in claim 1, wherein the inert gas is Ar.

5. The process set forth in claim 1, wherein the back-contact film is formed of a Sb$_2$Te$_3$ layer covered by a layer of Mo.

6. The process set forth in claim 5, wherein the Sb$_2$Te$_3$ layer is formed by sputtering at a temperature between about 250° C. and about 300° C.

7. The process set forth in claim 1, wherein the back-contact film is formed of a As$_2$Te$_3$ layer covered with a layer of Mo.

8. The process set forth in claim 7, wherein the As$_2$Te$_3$ layer is formed by sputtering at a temperature between about 200° C. and about 250° C.

9. The process set forth in claim 1, wherein the transparent conductive oxide is In$_2$O$_3$ doped with fluorine.

10. The process set forth in claim 9, wherein the TCO layer is formed by sputtering in an inert gas atmosphere comprising a mixture of hydrogen and a gaseous fluoroalkyle compound.

11. The process set forth in claim 10, wherein a mixture of Ar and hydrogen is used which comprises between about 1% and about 3% hydrogen by volume, and wherein the fluoroalkyle compound is CHF$_3$.

12. The process set forth in claim 1, wherein, as a source material for formation of the CdS and the CdTe films by close-spaced sublimation, a CdS or, respectively, CdTe material generally in the form of a compact block is used.

13. The process set forth in claim 12, wherein the compact block CdS (or CdTe) material is formed by covering pieces of CdS (or CdTe) material with boron oxide, heating the covered material to a temperature generally greater than its melting point in an inert gas atmosphere and at a pressure generally greater than 50 atm, and then cooling the material to room temperature, whereby the material is solidified in a generally compact block-like form.

14. A process for large-scale production of CdTe/CdS thin film solar cells, films of the cells being deposited in sequence, on a transparent substrate, the sequence comprising the steps of:
   depositing a film of a transparent conductive oxide (TCO) on the substrate;
   depositing a film of CdS on the TCO film;
   depositing a film of CdTe on the CdS film;
   treating the CdTe film with CdCl$_2$; and
   depositing a back-contact film on the treated CdTe film;
   wherein the transparent conductive oxide is In$_2$O$_3$ doped with fluorine.

15. The process set forth in claim 14, wherein the TCO layer is formed by sputtering in an inert gas atmosphere comprising a mixture of hydrogen and a gaseous fluoroalkyle compound.

16. The process set forth in claim 15, wherein a mixture of Ar and hydrogen is used which comprises between about 1% and about 3% hydrogen by volume, and wherein the fluoroalkyle compound is CHF$_3$.

17. A process for large-scale production of CdTe/CdS thin film solar cells, films of the cells being deposited, in sequence, on a transparent substrate, the sequence comprising the steps of:
- depositing a film of a transparent conductive oxide (TCO) on the substrate;
- depositing a film of CdS on the TCO film;
- depositing a film of CdTe on the CdS film;
- treating the CdTe film with $CdCl_2$; and
- depositing a back-contact film on the treated CdTe film;
- wherein as a source material for the formation of the CdS and the CdTe films by close-spaced sublimation, a CdS or, respectively, CdTe material generally in the form of a compact block is used.

18. The process set forth in claim 17, wherein the compact block of CdS (or CdTe) material is formed by covering pieces of CdS (or CdTe) material with boron oxide, heating the covered material to a temperature generally greater than its melting point in an inert gas atmosphere and at a pressure generally greater than about 50 atm, and then cooling the material to room temperature, whereby the material is solidified in a generally compact block-like form.

19. The process set forth in claim 1, wherein the transparent substrate is soda-lime glass.

* * * * *